(12) United States Patent
Hamamoto et al.

(10) Patent No.: US 8,889,809 B2
(45) Date of Patent: Nov. 18, 2014

(54) CYCLOALKYL GROUP-CONTAINING SILICONE RESIN COMPOSITION AND A METHOD OF USING THE SAME

(75) Inventors: Yoshihira Hamamoto, Annaka (JP); Tsutomu Kashiwagi, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 129 days.

(21) Appl. No.: 13/165,100

(22) Filed: Jun. 21, 2011

(65) Prior Publication Data

US 2011/0309407 A1 Dec. 22, 2011

(30) Foreign Application Priority Data

Jun. 22, 2010 (JP) ................... 2010-141691

(51) Int. Cl.
| | |
|---|---|
| C08G 77/08 | (2006.01) |
| H01L 23/29 | (2006.01) |
| C09D 7/12 | (2006.01) |
| G02B 1/04 | (2006.01) |
| C09D 183/04 | (2006.01) |
| C08L 83/04 | (2006.01) |

(52) U.S. Cl.
CPC ............ C09D 7/1241 (2013.01); H01L 23/296 (2013.01); G02B 1/041 (2013.01); C09D 183/04 (2013.01); C08L 83/04 (2013.01)
USPC ................ 528/15; 528/31; 528/32; 428/447; 524/588

(58) Field of Classification Search
USPC .................. 528/15, 31, 32; 524/588; 428/447
See application file for complete search history.

(56) References Cited

U.S. PATENT DOCUMENTS

| | | | |
|---|---|---|---|
| 6,815,520 B2 | 11/2004 | Yoneda et al. | |
| 7,323,250 B2 | 1/2008 | Tabei et al. | |
| 7,501,183 B2 | 3/2009 | Hara et al. | |
| 2008/0015326 A1* | 1/2008 | Kodama et al. | 528/15 |
| 2008/0249259 A1* | 10/2008 | Kashiwagi | 525/478 |
| 2009/0123764 A1* | 5/2009 | Morita et al. | 428/446 |

FOREIGN PATENT DOCUMENTS

| | | |
|---|---|---|
| JP | 2005-15666 A | 1/2005 |
| JP | 2005-272697 A | 10/2005 |
| JP | 4009067 B2 | 11/2007 |
| JP | 4114037 B2 | 7/2008 |
| JP | 2008-280367 A | 11/2008 |
| JP | 2009-215434 A | 9/2009 |

* cited by examiner

*Primary Examiner* — Margaret Moore
(74) *Attorney, Agent, or Firm* — Birch, Stewart, Kolasch & Birch, LLP

(57) ABSTRACT

One object of the present invention is to provide a silicone resin composition having remarkably low gas permeability which is useful for a purpose requiring lower gas permeability. Further, another object of the present invention is to provide an optical semiconductor device provided with a cured product obtained by curing the silicone resin composition which has discoloration resistance, durable reflection efficiency and high reliability. The present invention provides a silicone resin composition comprising (A) an organopolysiloxane having at least two alkenyl groups per molecule, and is represented by the average compositional formula (1), (B) an organohydrogenpolysiloxane having at least two hydrogen atoms bonded to a silicon atom, and is represented by the average compositional formula (2), (C) a catalytic amount of a curing catalyst, and (D) 0.001 to 3 parts by mass of an antioxidant, relative to a total 100 parts by mass of components (A) and (B). The silicone resin composition contains a mixture of three dimensional organopolysiloxanes and linear organopolysiloxanes having alkenyl groups and requires at least 20 to 80 mass %, based on total of (A) and (B), of cycloalkyl groups.

11 Claims, 1 Drawing Sheet

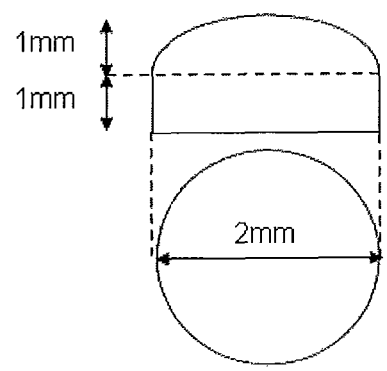

CYCLOALKYL GROUP-CONTAINING SILICONE RESIN COMPOSITION AND A METHOD OF USING THE SAME

CROSS REFERENCE

This application claims the benefits of Japanese Patent Application No. 2010-141691 filed on Jun. 22, 2010, the contents of which are herein incorporated by reference.

FIELD OF THE INVENTION

The present invention relates to a silicone resin composition which is useful for applications requiring lower gas permeability, more specifically, a silicone resin composition having a cycloalkyl group and, a method of using the same.

BACKGROUND OF THE INVENTION

In general, silicone resins have high gas permeability. Therefore, it was previously difficult to use silicone resins for general applications requiring gas resistance. Japanese Patent No. 4114037 describes a method where metallic powder is added in a silicone rubber composition to prevent a sulfur-containing gas from reaching electric and electronic components. However, transparency of the silicone rubber composition is poor. Japanese Patent No. 4009067 describes an addition-curable phenyl silicone resin composition which is transparent and highly hard. However, gas permeability of the resin composition is not low.

Further, silicone resin compositions are widely used as optical semiconductor encapsulating materials. However, in recent years, high brightness LEDs which generate high intensity light and a large amount of heat has been commercialized. Therefore, discoloration of an encapsulating material caused by a corrosive gas has been a problem. Japanese Patent Application Laid-Open No. 2005-272697 discloses that a hinderdamine light degradation-preventive agent is added to a phenyl silicone resin to provide an encapsulating material having good heat resistance, stable light resistance and good weather resistance. Japanese Patent Application Laid-Open No. 2009-215434 discloses that a silicone resin having an aliphatic hydrocarbon group as a substituent, such as a methyl silicone resin, prevents degradation of an organic resin package to extend a life of LED.

The afore-mentioned silicone resins have good light resistance, heat discoloration resistance and impact resistance, but have large linear expansion coefficient and high gas permeability and, therefore, have a problem in a reliability of an encapsulating material, which problem is caused by a corrosive gas. Further, it is known that the high gas permeability of the silicone resin leads to erosion of a silver plated surface in a substrate which is used in an optical semiconductor device such as an LED and, eventually, to decreased brightness. Therefore, there is a need to improve the silicone resin.

PRIOR LITERATURES

Patent Literatures

[Patent Literature 1] Japanese Patent No. 4114037
[Patent Literature 2] Japanese Patent No. 4009067
[Patent Literature 3] Japanese Patent Application Laid-Open No. 2005-272697
[Patent Literature 4] Japanese Patent Application Laid-Open No. 2009-215434

DISCLOSURE OF THE INVENTION

Problems to be Solved by the Invention

One object of the present invention is to provide a silicone resin composition having remarkably low gas permeability which is useful for a purpose requiring lower gas permeability. Further, another object of the present invention is to provide an optical semiconductor device provided with a cured product obtained by curing the silicone resin composition which has discoloration resistance, durable reflection efficiency and high reliability.

Means to Solve the Problems

To solve the aforesaid problems, the present inventors have made research and found that a silicone resin composition comprising the specific amount of cycloalkyl groups has remarkably low gas permeability.

Thus, the present invention provides a silicone resin composition comprising (A) an organopolysiloxane having at least two alkenyl groups per molecule, and is represented by the following average compositional formula (1):

$$R^1_a R^2_b R^3_c SiO_{(4-a-b-c)/2} \quad (1)$$

wherein $R^1$ is a cycloalkyl group having 4 to 8 carbon atoms, $R^2$ is a substituted or unsubstituted monovalent hydrocarbon group which has 1 to 10 carbon atoms and is not an alkenyl group nor a cycloalkyl group, $R^3$ is an alkenyl group having 2 to 8 carbon atoms, a is the number of 0.3 to 1.0, b is the number of 0.05 to 1.5, and c is the number of 0.05 to 0.8, provided that a+b+c is 0.5 to 2.0, (B) an organohydrogenpolysiloxane having at least two hydrogen atoms bonded to a silicon atom, that is, SiH groups, and is represented by the following average compositional formula (2):

$$R^1_a R^2_b H_d SiO_{(4-a-b-d)/2} \quad (2)$$

wherein $R^1$ is a cycloalkyl group having 4 to 8 carbon atoms, $R^2$ is a substituted or unsubstituted, monovalent hydrocarbon group which has 1 to 10 carbon atoms and is not an alkenyl group nor a cycloalkyl group, a is the number of 0 to 1.4, b is the number of 0.6 to 1.5, and d is the number of 0.05 to 1.0, provided that a+b+d is 1.0 to 2.5, (C) a catalytic amount of a curing catalyst, and (D) 0.001 to 3 parts by mass of an antioxidant, relative to a total 100 parts by mass of components (A) and (B).

Effects of the Invention

The present silicone resin composition has remarkably low gas permeability and solvent resistance and, therefore, is useful for various purposes requiring lower gas permeability. In particular, the silicone resin composition can be used as an encapsulating material for an optical semiconductor device, and provide an optical semiconductor device which has discoloration resistance and durable reflection efficiency.

BRIEF DESCRIPTION ON A DRAWING

FIG. 1 is a schematic view of an example for a lens product prepared from the present silicone resin composition.

BEST MODES OF THE INVENTION

The present invention will be described below in detail.
(A) Organopolysiloxane

The component (A) is an organopolysiloxane having at least two alkenyl groups per molecule, and is represented by the following average compositional formula (1):

$$R^1_a R^2_b R^3_c SiO_{(4-a-b-c)/2} \quad (1)$$

wherein a is the number of 0.3 to 1.0, preferably 0.4 to 0.8, b is the number of 0.05 to 1.5, preferably 0.2 to 0.8 and c is the number of 0.05 to 0.8, preferably 0.05 to 0.3, provided that a+b+c is 0.5 to 2.0, preferably 0.5 to 1.6.

In the afore-mentioned formula (1), $R^1$ is a cycloalkyl group having 4 to 8, preferably 5 to 6, carbon atoms, and a cyclohexyl group is more preferred. $R^2$ is a substituted or unsubstituted monovalent hydrocarbon group which has 1 to 10, preferably 1 to 6, carbon atoms and is not an alkenyl group nor a cycloalkyl group. Examples of $R^2$ include alkyl groups such as methyl, ethyl, propyl, isopropyl, butyl, isobutyl, tert-butyl, pentyl, neopentyl, hexyl, octyl, nonyl and decyl groups; aryl groups such as phenyl, tolyl, xylyl, and naphthyl groups; aralkyl groups such as benzyl, phenylethyl and phenylpropyl groups; and those groups where a part or the whole of their hydrogen atoms are replaced with a halogen atom (s), such as fluorine, bromine and chlorine atoms, or a cyano group, such as halogen-substituted alkyl groups, for instance, chloromethyl, chloropropyl, bromoethyl and trifluoropropyl groups, and a cyanoethyl group.

In the afore-mentioned formula (1), $R^3$ is an alkenyl group having 2 to 8, preferably 2 to 6, carbon atoms. Examples of $R^3$ include vinyl, allyl, propenyl, isopropenyl, butenyl, hexenyl, cyclohexenyl and octenyl groups. Among these, vinyl and allyl groups are preferred.

The organopolysiloxane comprises a linear structure whose main chain is composed of repeating diorganosiloxane units represented by $R_2SiO_{2/2}$ and which has triorganosiloxy groups represented by $R_3SiO_{1/2}$ at the both terminals, wherein R is as defined for $R^1$, $R^2$ or $R^3$ mentioned above. Particularly, preferred for workability and curability is a linear organopolysiloxane which is represented by the following formula (3) and has each one or more vinyl groups on a silicon atom at the both terminals and has a viscosity at 25 degrees C. of 10 to 1,000,000 mPa·s, preferably 1,000 to 50,000 mPa·s. The viscosity is determined, for instance, with a rotational viscometer. The organopolysiloxane may comprise a small amount of branched structure, for instance, trifunctional siloxane unit, in its molecular chain.

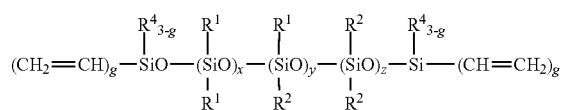

(3)

wherein, $R^1$ and $R^2$ are as defined above, $R^4$ is as defined for $R^1$ or $R^2$, g is an integer of 1, 2 or 3, and x, y and z are zero or a positive integer which satisfy the equation $1 \leq (x+y+z) \leq 1,000$, provided that at least one of x and y is 1 or larger.

In the afore-mentioned formula (3), x, y and z are zero or a positive integer which satisfy the equation $1 \leq (x+y+z) \leq 1,000$, preferably $5 \leq (x+y+z) \leq 500$, more preferably $30 \leq (x+y+z) \leq 500$, where preferably $0.5 < (x+y)/(x+y+z) \leq 1.0$.

Examples of the organopolysiloxanes represented by the afore-mentioned formula (3) include the following.

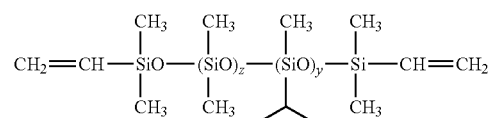

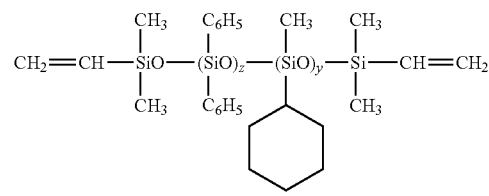

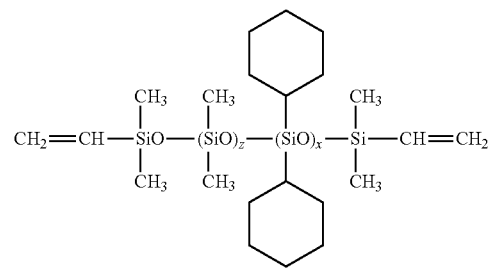

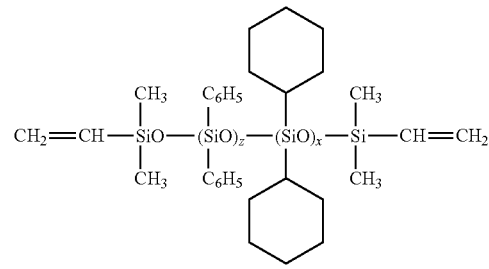

wherein x, y and z are as defined above.

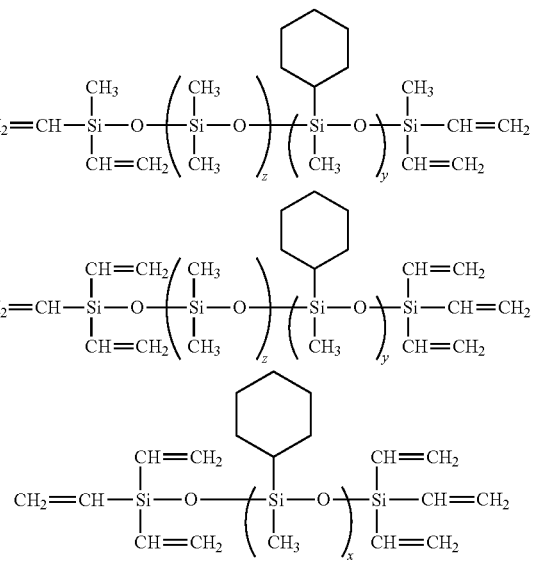

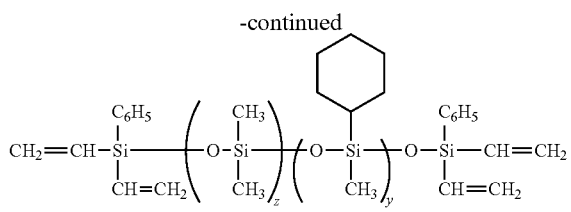

wherein z and y are as defined above.

The present composition may further contain an organopolysiloxane which does not have a cycloalkyl group, that is, where x and y are zero in the afore-mentioned formula (3), in combination with the afore-mentioned organopolysiloxane having a cycloalkyl group. When such an organopolysiloxane with no cycloalkyl group is contained in the present composition, its amount ranges from 1 to 40 mass %, preferably 1 to 30 mass %, based on the mass of organopolysiloxane (A).

Examples of the organopolysiloxane with no cycloalkyl group include the following.

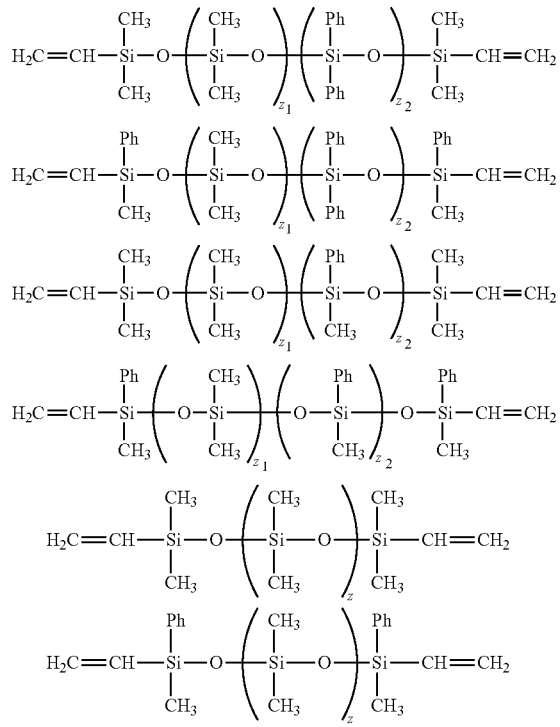

wherein z is an integer which satisfy the equation $1 \leq z \leq 1,000$, preferably $5 \leq z \leq 500$, more preferably $30 \leq z \leq 500$. $z_1$ and $z_2$ are an integer which satisfy the equation $1 \leq (z_1+z_2) \leq 1,000$, preferably $5 \leq (z_1+z_2) \leq 500$, more preferably $30 \leq (z_1+z_2) \leq 500$.

A part of component (A) may have a resin structure, namely, three dimensional network. The organopolysiloxane having a resin structure preferably comprises $R^6SiO_{1.5}$ units, $R^5_k R^6_p SiO$ units and $R^5_q R^6_r SiO_{0.5}$ units, wherein $R^5$ is a vinyl or allyl group, $R^6$ is a substituted or unsubstituted monovalent hydrocarbon group which is not an alkenyl group, k is 0 or 1, and p is 1 or 2, provided that a total of k and p is 2, q is 1, 2 or 3, and r is 0, 1 or 2, provided that a total of q and r is 3. $R^6$ is as defined for $R^1$ and $R^2$ mentioned above and, among these, a cyclohexyl group is preferred.

Here the $R^6SiO_{1.5}$ unit is abbreviated as "a"; the $R^5_k R^6_p SiO$ unit, as "b"; and the $R^5_q R^6_r SiO_{0.5}$ unit, as "c". A molar ratio, (b+c)/a, is preferably 0.01 to 1, more preferably 0.1 to 0.5; and a molar ratio, c/a, is preferably 0.05 to 3, more preferably 0.1 to 0.5. A weight average molecular weight of the organopolysiloxane, as determined by GPC, reduced to polystyrene, is preferably in the range of 500 to 10,000.

The organopolysiloxane having a resin structure may further comprise small amounts of bifunctional siloxane units and trifunctional siloxane units, that is, organosilsesquioxane units, in addition to the aforesaid a, b, and c units, as long as the purposes of the present invention are not obstructed.

The organopolysiloxane having a resin structure can be easily prepared by combining source compounds for a, b, and c units so that the afore-mentioned molar ratios are met and, for instance, subjecting them to co-hydrolysis in the presence of an acid.

As the source compound for a, use may be made of cyclohexyltrichlorosilane, cyclohexyltrimethoxysilane, cyclohexyltriethoxysilane, phenyltrimethoxysilane and methyltrimethoxysilane.

As the source compound for b, the following compounds can be used:

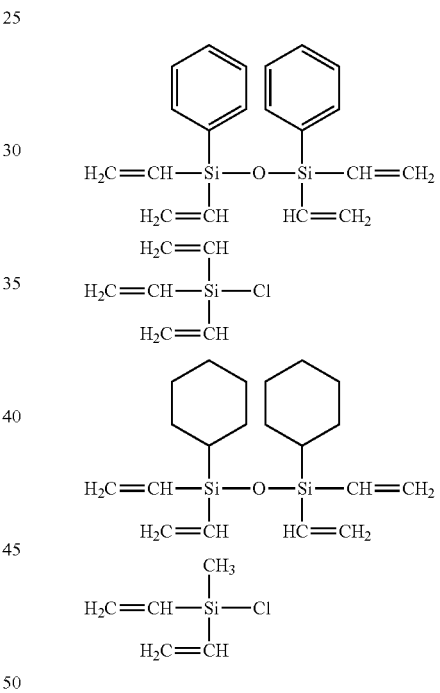

As the source compound for c, the following compounds can be used:

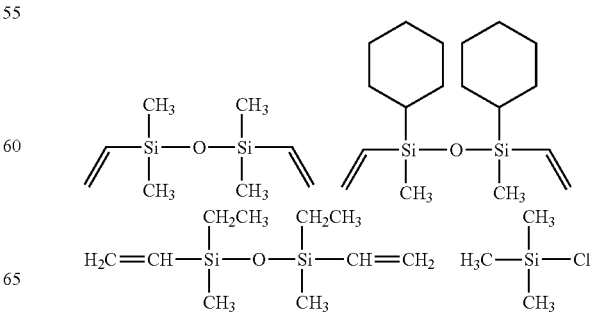

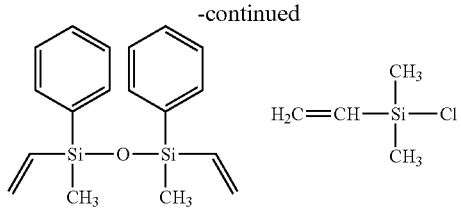

The organopolysiloxane having a resin structure is used to improve physical strength and tackiness of a surface of a cured product. This organopolysiloxane is preferably contained in an amount of 20 to 95% by mass, more preferably 40 to 90% by mass, in the component (A). If the amount of the organopolysiloxane having a resin structure is too small, the effect of improving the physical strength and tackiness of a surface of a cured product is not sufficiently attained. If the amount is too large, a viscosity of the composition is so high that cracks may occur in a cured product.

(B) Organohydrogenpolysiloxane

Organohydrogenpolysiloxane (B) functions as a cross-linking agent. The hydrogen atom bonded to a silicon atom in the component (B), hereinafter called SiH group, addition reacts with the alkenyl group in the component (A) to form a cross-linked structure. Any organohydrogenpolysiloxane may be used, as long as it has at least two, preferably at least three, hydrogen atoms bonded to a silicon atom, that is, SiH groups, per molecule. In particular, preferred is the organohydrogenpolysiloxane represented by the following average compositional formula (2):

$$R^1_a R^2_b H_d SiO_{(4-a-b-d)/2} \quad (2)$$

wherein $R^1$ is a cycloalkyl group having 4 to 8 carbon atoms, $R^2$ is a substituted or unsubstituted, monovalent hydrocarbon group which has 1 to 10 carbon atoms and is not an alkenyl group nor a cycloalkyl group, a is the number of 0 to 1.4, b is the number of 0.6 to 1.5, and d is the number of 0.05 to 1.0, provided that a+b+d is 1.0 to 2.5.

In the afore-mentioned formula (2), $R^1$ is a cycloalkyl group having 4 to 8, more preferably 5 to 6, carbon atoms, $R^2$ is a substituted or unsubstituted, monovalent hydrocarbon group which has 1 to 10, preferably 1 to 7, carbon atoms and is not an alkenyl group nor cycloalkyl group. Examples of $R^2$ include lower alkyl groups such as a methyl group, aryl groups such as a phenyl group and the groups as defined for $R^2$ in the afore-mentioned formula (1). a is the number of 0 to 1.4, preferably 0 to 1.0, b is the number of 0.6 to 1.5, preferably 0.8 to 1.2 and d is the number of 0.05 to 1.0, preferably 0.3 to 0.8, provided that a+b+d is 1.0 to 2.5. The hydrosilyl group may be at the terminal or in a middle part of the molecular chain, and, thus, may be present anywhere in the molecule.

Examples of the organohydrogenpolysiloxane include tris(dimethylhydrogensiloxy)methylsilane, tris(dimethylhydrogensiloxy)phenylsilane, 1,1,3,3-tetramethyldisiloxane, 1,3,5,7-tetramethylcyclotetrasiloxane, methylhydrogenpolysiloxane with both ends blocked with trimethylsiloxy groups, copolymers of dimethylsiloxane and methylhydrogensiloxane with both ends blocked with trimethylsiloxy groups, dimethylpolysiloxane with both ends blocked with dimethylhydrogensiloxy groups, copolymers of dimethylsiloxane and methylhydrogensiloxane with both ends blocked with dimethylhydrogensiloxy groups, copolymers of methylhydrogensiloxane and diphenylsiloxane with both ends blocked with trimethylsiloxy groups, copolymers of methylhydrogensiloxane, diphenylsiloxane and dimethylsiloxane with both ends blocked with trimethylsiloxy groups, copolymers composed of $(CH_3)_2HSiO_{1/2}$ units and $SiO_{4/2}$ units, and copolymers composed of $(CH_3)_2HSiO_{1/2}$ units, $SiO_{4/2}$ units and $(C_6H_5)SiO_{3/2}$ units.

Organohydrogenpolysiloxanes prepared from the units represented by the following structure can also be used.

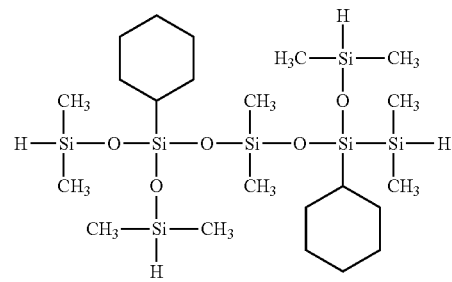

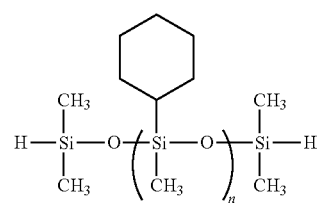

wherein n is an integer of from 1 to 10.

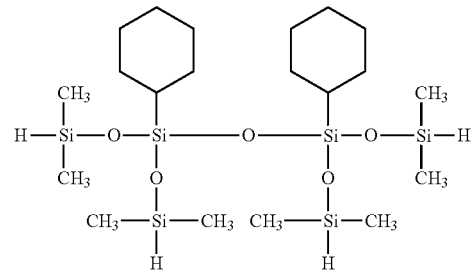

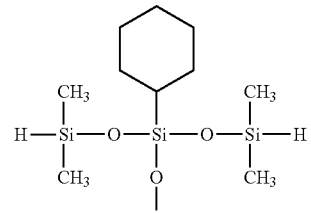

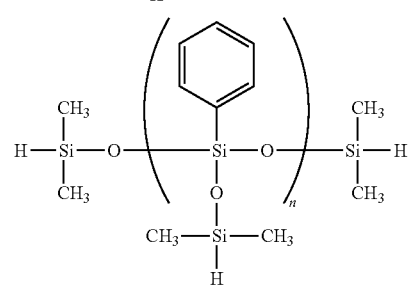

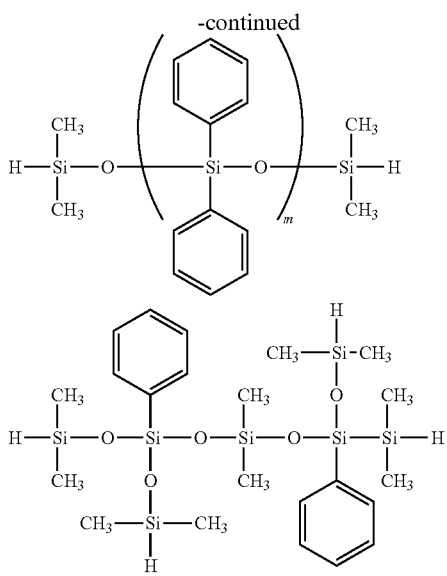

wherein m and n are an integer of from 1 to 10.

The molecular structure of the organohydrogenpolysiloxane may be any of linear, cyclic, branched and three-dimensional network structures. The number of the silicon atoms in one molecule or the degree of polymerization is 3 to 100, preferably 3 to 10.

This organohydrogenpolysiloxane can be prepared according to known methods, for instance, by hydrolyzing chlorosilane represented by $R^6SiHCl_2$, $R^6_3SiCl$, $R^6_2SiCl_2$ or $R^6_2SiHCl$ wherein $R^6$ is as defined above, or by equilibrating the resulting siloxanes in the presence of a strong acid catalyst.

The amount of the organohydrogenpolysiloxane may be so as to be effective for curing the component (A), particularly such as to give the hydrosilyl group of 0.5 to 4.0 equivalents, preferably 0.7 to 3.0 equivalents, more preferably 0.9 to 1.5 equivalents, per equivalent of the alkenyl group in the component (A). If the amount is smaller than the afore-mentioned lower limit, the curing reaction does not proceed enough to obtain a cured product. If the amount is larger than the afore-mentioned upper limit, a lot of unreacted SiH groups remain in a cured product to cause change in the rubber properties with time.

The organohydrogenpolysiloxans with no cycloalkyl group may be used in combination with the afore-mentioned organohydrogenpolysiloxans having a cycloalkyl group. The present silicone resin composition preferably has a cycloalkyl group content of 20 to 80 mass %, preferably 30 to 50 mass %, based on the total mass of components (A) and (B). If the content of the cycloalkyl group is smaller than 20 mass %, gas permeability of a cured product is high to allow erosion of a silver surface in an optical semiconductor package so as to decrease the brightness of the optical semiconductor element.

(C) Curing Catalyst

The curing catalyst is added to accelerate an addition reaction. The catalyst may be a compound of platinum, palladium or rhodium, and those comprising a metal of the platinum group are preferred in costs. Examples of the catalyst include $H_2PtCl_6 \cdot mH_2O$, $K_2PtCl_6$, $KHPtCl_6 \cdot mH_2O$, $K_2PtCl_4$, $K_2PtCl_4 \cdot mH_2O$, and $PtO_2 \cdot mH_2O$, wherein m is a positive integer, and complexes thereof with a hydrocarbon such as an olefin, an alcohol or a vinyl group-containing organopolysiloxane. The afore-mentioned catalysts may be used alone or in a combination thereof.

The catalysts may be used in a catalytic amount, preferably 0.0001 to 0.2 part by mass, more preferably 0.0001 to 0.05 part by mass, reduce to a platinum group metal, relative to the total 100 parts by mass of components (A) and (B).

(D) Antioxidant

The antioxidant is added as a heat deterioration preventive agent to improve the heat resistance of the silicone resin composition. Hindered phenol antioxidants are preferred as the antioxidant. The amount of the antioxidant ranges from 0.001 to 3 parts by mass, preferably 0.05 to 1 part by mass, more preferably 0.05 to 0.1 part by mass, relative to the total 100 parts by mass of the components (A) and (B). If the amount is larger than the afore-mentioned upper limit, the excessive antioxidant separates out on the surface of the cured product. If the amount is less than the afore-mentioned lower limit, discoloration resistance of the cured product is poor.

Examples of the antioxidant include pentaerythritol tetrakis[3-(3,5-di-tert-butyl-4-hydroxyphenyl)propionate], N,N'-propane-1,3-diylbis[3-(3,5-di-tert-butyl-4-hydroxyphenyl)propionamide], thiodiethylenebis[3-(3,5-di-tert-butyl-4-hydroxyphenyl)propionate], octadecyl-3-(3,5-di-tert-butyl-4-hydroxyphenyl)propionate, 6,6'-di-tert-butyl-2,2'-thiodi-p-cresol, N,N'-hexane-1,6-diylbis[3-(3,5-di-tert-butyl-4-hydroxyphenylpropionamide)], benzenepropanoic acid, 3,5-bis(1,1-dimethylethyl)-4-hydroxy, alkyl ester having C7-C9 side chain, diethyl[[3,5-bis(1,1-dimethylethyl)-4-hydroxyphenyl]methyl]phosphonate, 2,2'-ethylenebis[4,6-di-tert-butylphenol], 3,3',3",5,5',5"-hexa-tert-butyl-a,a',a"-(mesitylene-2,4,6-triyl)tri-p-cresol, calciumdiethylbis[[[3,5-bis(1,1-dimethylethyl)-4-hydroxyphenyl]methyl] phosphonate], 4,6-bis(octylthiomethyl)-o-cresol, 4,6-bis(dodecylthiomethyl)-o-cresol, ethylenebis(oxyethylene)bis [3-(5-tert-butyl-4-hydroxy-m-tolyl)propionate], hexamethylenebis[3-(3,5-di-tert-butyl-4-hydroxyphenyl) propionate], 1,3,5-tris(3,5-di-tert-butyl-4-hydroxybenzyl)-1,3,5-triazine-2,4,6-trione, 1,3,5-tris[(4-tert-butyl-3-hydroxy-2,6-xylyl)methyl]-1,3,5-triazine-2,4,6-(1H,3H,5H)-trione, 6,6'-di-tert-butyl-4,4'-tiodi-m-cresol, diphenylamine, reaction product of N-phenylbenzenamine with 2,4,4'-trimethylpentene, 2,6-di-tert-butyl-4-(4,6-bis(octylthio)-1,3,5-triazin-2-ylamino)phenol, 3,4-dihydro-2,5,7,8-tetramethyl-2-(4,8,12-trimethyltridecyl)-2H-1-benzopyran-6-ol, 2',3-bis[[3-[3,5-di-tert-butyl-4-hydroxyphenyl]propionyl]] propionohydrazide, didodecyl 3,3'-thiodipropionate and dioctadecyl 3,3'-thiodipropionate. These antioxidants may be used also in combination of two or more thereof.

(E) Adhesion-Imparting Agent

The present silicone resin composition may further comprise an adhesion-imparting agent in addition to components (A) to (D). Examples of the adhesion-imparting agent include vinyltrimethoxysilane, vinyltriethoxysilane, 2-(3,4-epoxycyclohexyl)ethyltrimethoxysilane, 3-glysidoxypropyltrimethoxysilane, 3-glysidoxypropylmethyldiethoxysilane, 3-glysidoxypropyltriethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, N-2(aminoethyl)3-aminopropylmethyldimethoxysilane, N-2(aminoethyl)3-aminopropyltrimethoxysilane, N-2(aminoethyl)3-aminopropyltriethoxysilane, 3-aminopropyltrimethoxylsilane, 3-aminopropyltriethoxylsilane, N-phenyl-3-aminopropyltrimethoxylsilane and 3-mercaptopropyltrimethoxylsilane; and trimethoxysilane, tetramethoxysilane, phenyltrimethoxysilane, dipehyldimethoxysilane and an oligomer thereof. The afore-mentioned adhesion-imparting agent may be used alone or in a combination thereof. The amount of the adhesion-imparting agent ranges from 0.1 to 10 parts by mass, preferably 0.1 to 5 parts by mass, relative to the total 100 parts by mass of the components (A), (B), (C) and (D).
An adhesion-imparting agent represented by the following can also be used.
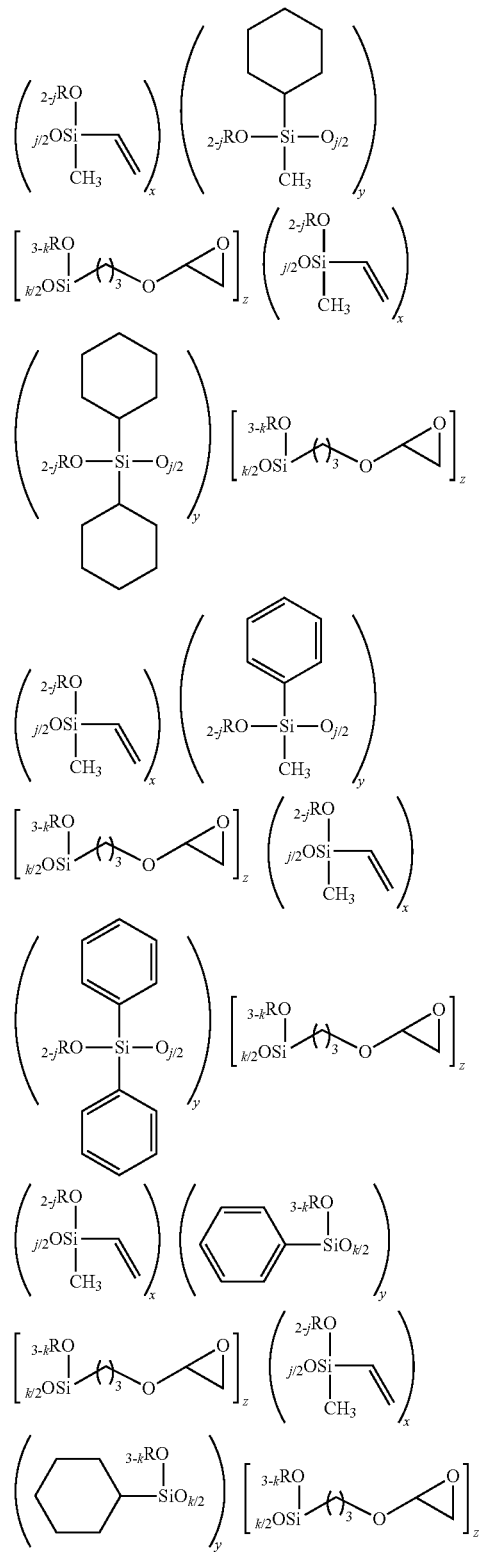

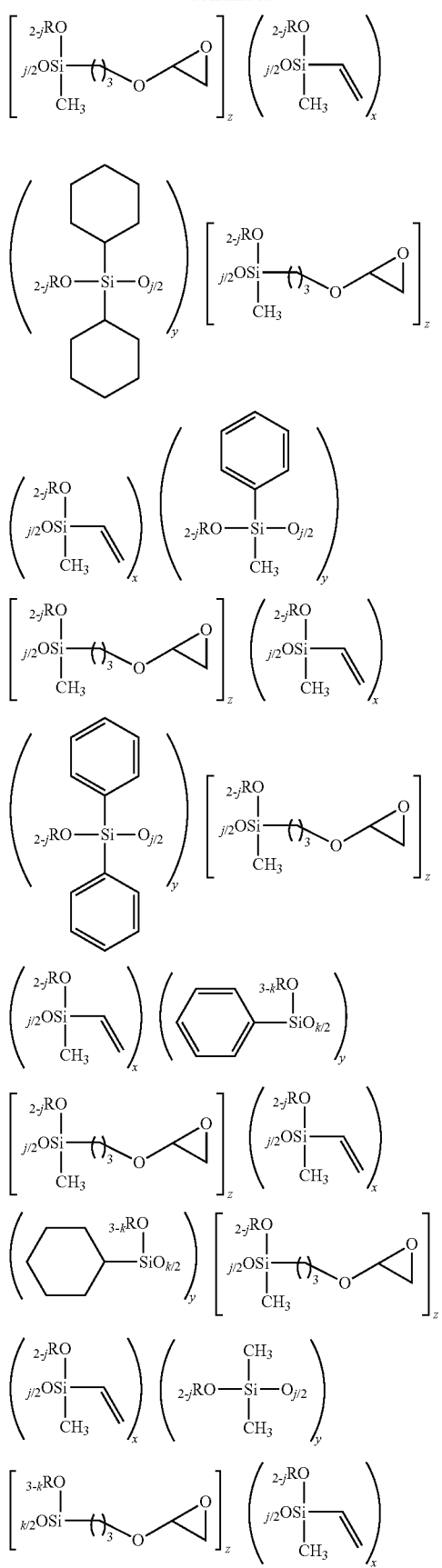
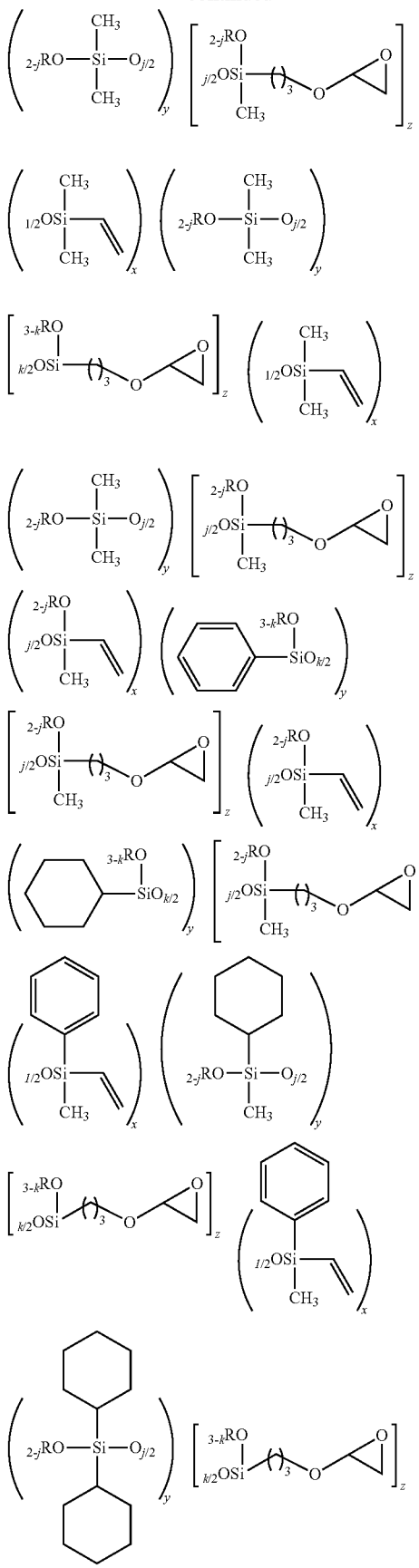

-continued

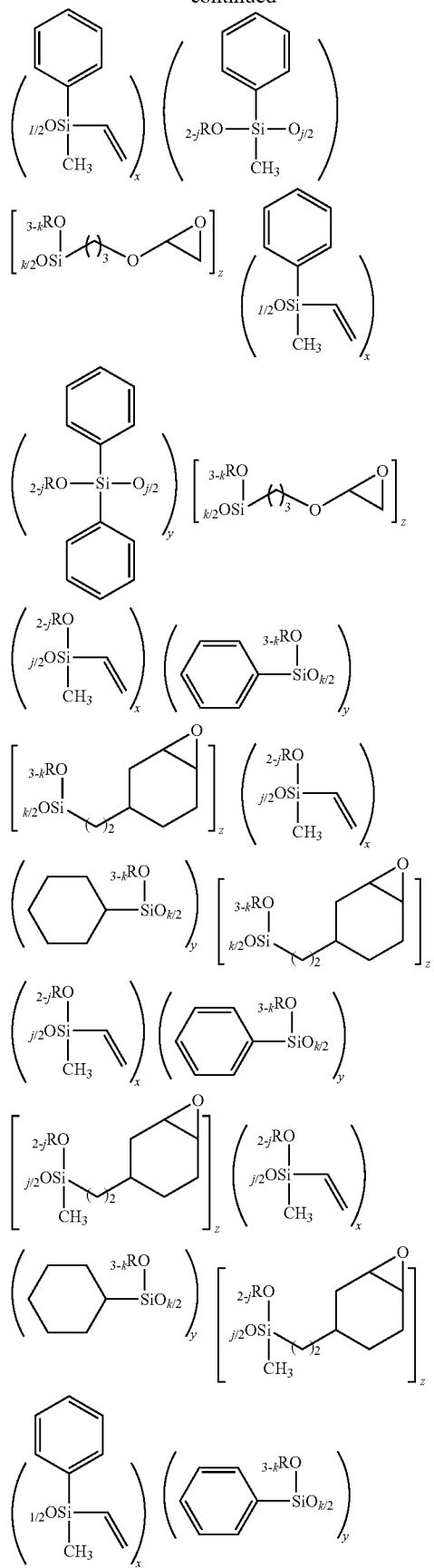

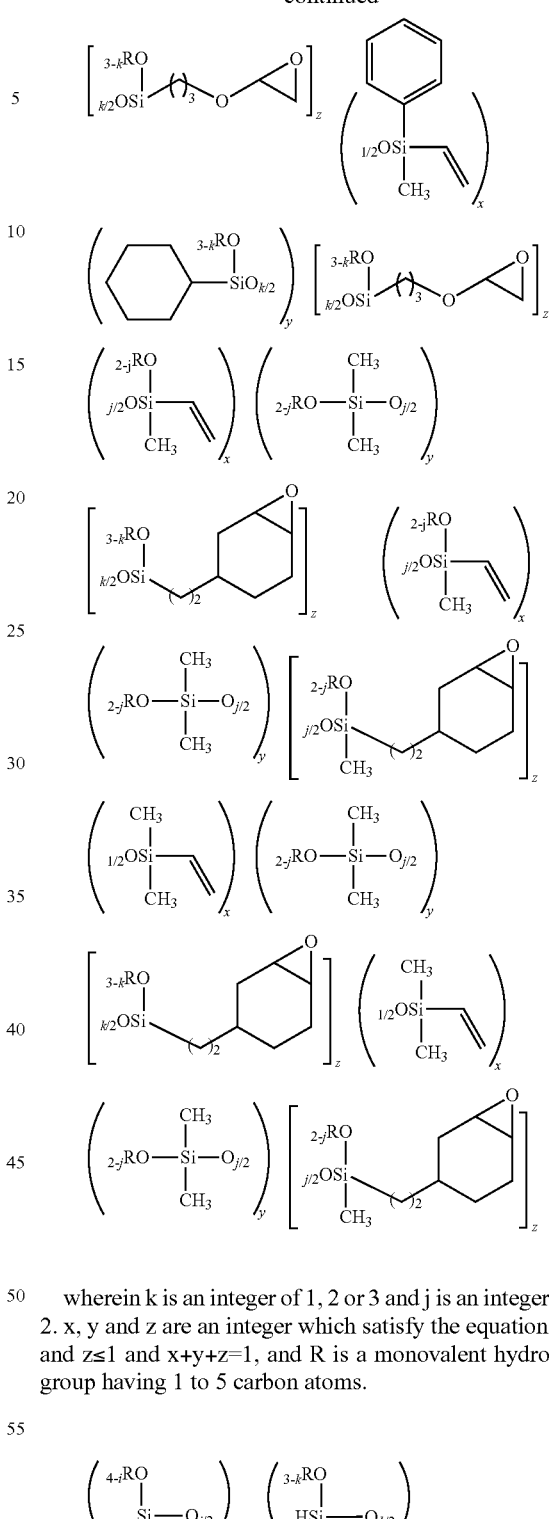

wherein k is an integer of 1, 2 or 3 and j is an integer of 1 or 2. x, y and z are an integer which satisfy the equation $0 \leq x$, y and $z \leq 1$ and $x+y+z=1$, and R is a monovalent hydrocarbon group having 1 to 5 carbon atoms.

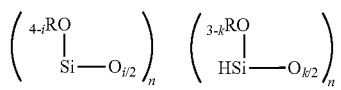

wherein i is an integer of 1, 2, 3 or 4 and k is an integer of 1, 2 or 3. n is an integer which satisfy the equation $1 \leq n \leq 100$, and R is a monovalent hydrocarbon group having 1 to 5 carbon atoms.

In particular, preferred is the adhesion-imparting agent represented by the following formula.

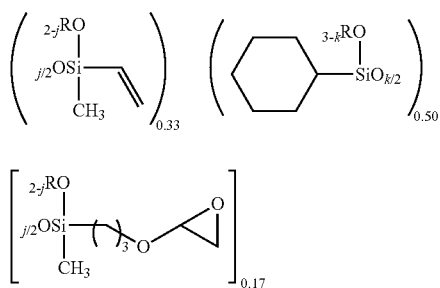

wherein j and k are as defined above, and R is a monovalent hydrocarbon group having 1 to 5 carbon atoms.

The present silicone resin composition may further comprise conventional additives, if necessary, in addition to components (A) to (E). Examples of the additives include reinforcing inorganic fillers such as fumed silica and fumed titanium dioxide; non-reinforcing inorganic fillers such as calcium carbonate, calcium silicate, titanium dioxide, iron (III) oxide, carbon black and zinc oxide; light degradation-preventive agent such as hindered amine; and reactive diluents such as vinylethers, vinyl amides, epoxy resins, oxetanes, allyl phthalates and vinyl adipate. These additives may be properly added in such an amount that the purposes of the present invention are not obstructed. In particular, when an inorganic filler is added, its amount ranges from 10 to 100 parts by mass, preferably 10 to 50 parts by mass, relative to the total 100 parts by mass of the components (A) and (B).

Method for Preparing the Silicone Resin Composition

The present silicone resin composition can be prepared by stirring, melting, mixing and dispersing the aforesaid components altogether or sequentially, if necessary, under heating. The components (A) and (C), and the component (B) are stored preferably in a form of two separate solutions to avoid a curing reaction before use, and mixed at the time of use to cause curing. If the components (B) and (C) are stored together in one solution, a dehydrogen reaction may occur. Therefore, it is preferred to store the component (B) and component (C) separately. Alternatively, a small amount of a cure inhibitor such as acetylenealcohol may be added to a solution of the components (A), (B) and (C) to store.

Any apparatus can be used for the stirring and so on, such as a grinding machine equipped with a stirrer and a heater, a three-roll mill, a ball mill, and a planetary mixer. These apparatuses may be used in combination, if necessary. The viscosity of the present silicone resin composition, as determined at 25 degrees C. with a rotational viscometer, ranges preferably from 100 to 10,000,000 mPa·s, more preferably 300 to 500,000 mPa·s.

The silicone resin composition can be promptly cured by heating, if necessary. Curing conditions may be any conventional ones and selected depending on the use, and usually 40 to 250 degrees C., preferably 60 to 200 degrees C., for 5 minutes to 10 hours, preferably 30 minutes to 6 hours, but are not limited to those.

The present silicon resin composition provides a cured product whose moisture permeability at a thickness of the product of 1 mm is 15 g/m²·day or less, preferably 10 g/m²·day or less. The smaller moisture permeability is preferable. If the moisture permeability is more than 15 g/m²·day, moisture goes through a cured product under moisture-absorption degradation conditions and, therefore, in a case where the silicone resin composition is cured on a metal substrate, the interface with the metal substrate is eroded. Further, the cured product swells to cause cracks and peeling at the interface. The afore-mentioned ranges of moisture permeability may be attained by that the silicone resin composition has the content of the cycloalkyl group of 20 to 80 mass %, preferably 30 to 50 mass %, based on the total mass of the component (A) and the component (B). The moisture permeability is determined according to the Japanese Industrial Standards (JIS) K 7129.

The present silicone resin composition can be used, for instance, for lens molding materials, silicone coating materials for vehicle installation, resin materials for screen-print which dissolved in a solvent such as cyclohexanone, film materials, corrosion preventing or waterproof sealing materials for constructions, waterproof protective materials for cooking equipments, such as packings for humid conditions of containers, waterproof treatment materials for baby toys, such as toys which do not swell with baby's saliva and are soft, glass coating materials, preservation or waterproof paint materials for wood, additive in filter materials for fine powder, such as an additive for an air conditioner filter which has an effect of removing fine powder, and waterproof or gas corrosion preventing coating materials for metals.

The hardness of a cured product of the present silicone resin composition for the afore-said applications is preferably 90 or less, more preferably 30 to 90, as determined with a type A durometer, as stipulated in the Japanese Industrial Standards K 6301. This hardness of a cured product can be attained by the presence of the small number of cross-linkage points between the component (A) and the component (B). Preferably, the silicone resin composition contains the $R_2SiO$ unit of 20 mass % or more, based on the total mass of silicone units represented by $R_nSiO_{(4-n/2)}$.

In particular, when the silicone resin composition is used for lens molding materials, an Abbe's number of the cured product is preferably no less than 40 and no more than 90, more preferably no less than 40 and no more than 70. If the Abbe's number is less than 40, a chromatic aberration is too large, so that light tends to diffuse and an incremental luminous flux is small. If the Abbe's number is more than 90, it is difficult to prepare a lens having a low refractive index. A molded lens can be prepared by molding from the afore-said silicone resin composition according to any conventional method, such as injection molding or transfer molding. Abbe's number ($v_D$) indicates wavelength dependency of refractive indices, that is, a degree of light dispersion. The Abbe's number is defined by the following formula.

$$v_D=(n_D-1)/(n_F-n_C)$$

wherein $n_C$, $n_D$ and $n_F$ are the refractive indices at the wavelengths of the Fraunhofer C special lines: 656 nm, D special lines: 589 nm, and F special lines: 486 nm, respectively.

The present silicone resin composition has higher light transmittance, and can provide a cured product which has a light transmittance of 90% or more, in particular 95% or more, as determined at one wavelength selected from 400 nm to 500 nm. In particular, when the silicone resin composition is used for an encapsulating material for an optical semiconductor device, it is preferred that the light transmittance determined at wavelength of 450 nm is 90% or more, more preferably 95% or more. If the light transmittance is less than 90%, the incremental luminous flux which is a criterion for brightness is small.

The present silicone resin composition shows good adhesion to package materials such as LCP, and to metal substrates. Therefore, the present silicone resin composition is suitable as an encapsulating material for optical semiconductor elements such as LEDs, photodiodes, CCDs, CMOSes and photo couplers. In particular, the present silicone resin composition is advantageously used as an encapsulating material for high brightness LEDs. An optical semiconductor device which is encapsulated with the cured product of the present silicone resin composition has good durability in reflection efficiency on account of the less discoloration of the cured product.

The method for preparing the optical semiconductor device using the present silicone resin composition may be chosen from any conventional methods, depending on a specific type of an optical semiconductor element. Curing conditions may be any conventional ones and selected depending on the use, and usually 40 to 250 degrees C., preferably 60 to 200 degrees C., for 5 minutes to 10 hours, preferably 30 minutes to 6 hours, but are not limited to those.

When a silver plated lead frame is encapsulated with the cured product obtained from the present silicone resin composition, it is preferred that the surface of the silver plated lead frame is treated in advance to increase the wettability with the silicone resin composition. The surface treatment is conducted preferably in a dry method, such as ultraviolet treatment, ozone treatment and plasma treatment, for workability and maintenance of the equipment, and plasma treatment is particularly preferred. A material of a pre-molded package preferably contains a silicone component of 15 mass % or more, based on total mass of the organic components, to increase compatibility with the silicone resin composition. Here, the silicone component means a chemical compound having Si units or a polymer thereof. If the amount of the silicone component is less than 15% by mass, the compatibility with the silicone resin composition is low, so that interstices occur between the silicone resin composition and the pre-molded package in encapsulation, and an optical semiconductor device obtained tends to cause cracks.

EXAMPLES

The present invention will be explained below in further detail with reference to a series of the Examples and the Comparative Examples, though the present invention is in no way limited by these Examples.

Synthesis Example 1

In a flask, placed were 1050 g of xylene, 3652 g of water, 2625 g of 12 mols/L HCl (31.5 mols). To the resulting mixture, was dropwise added a mixture of 2146 g of cyclohexyltrimethoxysilane (10.5 mols), 543 g of vinyl dimethyl chlorosilane (4.50 mols) and 1504 g of xylene, and stirred for 3 hours. The acid was separated, and the resulting mixture was washed with water. The remaining mixture was subjected to azeotropic dehydration. Then, 6 g of KOH (0.15 mols) was added to the resulting mixture and heated at 150 degrees C. to reflux through the night. Then, the reaction mixture was neutralized with 27 g of trimethylchlorosilane and 24.5 g of potassium acetate, filtered and, subsequently, subjected to stripping under reduced pressure to remove the solvent to obtain the organopolysiloxane (Resin 1) represented by the following formula. The vinyl equivalent was 0.203 mol/100 g.

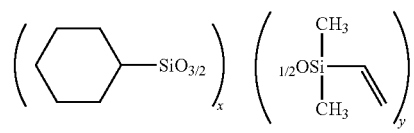

wherein x:y=7:3.

Synthesis Example 2

In a flask, placed were 61.22 g of xylene, 612.19 g of water, 408.13 g of 12 mols/L HCl (4.898 mols). To the resulting mixture, was dropwise added a mixture of 461.20 g of cyclohexylmethyldimethoxysilane (2.449 mols), 183.66 g of xylene, and stirred for 3 hours. The acid was separated, and the resulting mixture was washed with water. The remaining mixture was subjected to azeotropic dehydration. Then, 0.07 g of KOH and 15.18 g of (ViSiMe$_2$)$_2$O (0.0816 mols) were added to the resulting mixture and heated at 150 degrees C. to reflux through the night. Then, the reaction mixture was neutralized with 1.00 g of 2-chloroethanol, subjected to stripping under reduced pressure to remove the solvent to obtain the organopolysiloxane (Resin 2) represented by the following formula. The vinyl equivalent was 0.04395 mol/100 g.

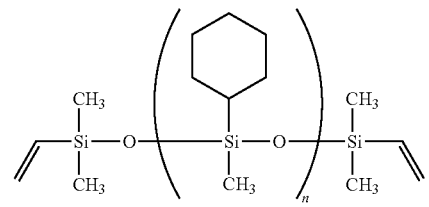

wherein average of n was 30.

Synthesis Example 3

In a flask, placed were 61.22 g of xylene, 612.19 g of water, 408.13 g of 12 mols/L HCl (4.898 mols). To the resulting mixture, was dropwise added a mixture of 461.20 g of cyclohexylmethyldimethoxysilane (2.449 mols), 183.66 g of xylene, and stirred for 3 hours. The acid was separated, and the resulting mixture was washed with water. The remaining mixture was subjected to azeotropic dehydration. Then, 0.07 g of KOH and 6.51 g of (ViSiMe$_2$)$_2$O (35.0 mmols) were added to the resulting mixture and heated at 150 degrees C. to reflux through the night. Then, the reaction mixture was neutralized with 1.41 g of 2-chloroethanol, subjected to stripping under reduced pressure to remove the solvent to obtain the organopolysiloxane (Resin 3) represented by the following formula. The vinyl equivalent was 0.0188 mol/100 g.

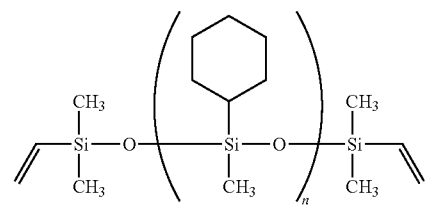

wherein average of n was 70.

Synthesis Example 4

In a flask, placed were 61.22 g of xylene, 612.19 g of water, 408.13 g of 12 mols/L HCl (4.898 mols). To the resulting mixture, was dropwise added a mixture of 461.20 g of cyclohexylmethyldimethoxysilane (2.449 mols), 183.66 g of xylene, and stirred for 3 hours. The acid was separated, and the resulting mixture was washed with water. The remaining mixture was subjected to azeotropic dehydration. Then, 0.07 g of KOH and 3.14 g of (ViSiMe$_2$)$_2$O (16.89 mmols) were added to the resulting mixture and heated at 150 degrees C. to reflux through the night. Then, the reaction mixture was neutralized with 0.86 g of 2-chloroethanol (0.017 mols), subjected to stripping under reduced pressure to remove the solvent to obtain the organopolysiloxane (Resin 4) represented by the following formula. The vinyl equivalent was 0.009875 mol/100 g.

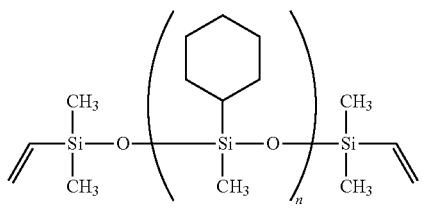

wherein average of n was 145.

Synthesis Example 5

In a flask, placed were 30.53 g of xylene, 305.30 g of water, 203.53 g of 12 mols/L HCl (2.442 mols). To the resulting mixture, was dropwise added a mixture of 230.00 g of cyclohexylmethyldimethoxysilane (1.221 mols), 91.59 g of xylene, and stirred for 3 hours. The acid was separated, and the resulting mixture was washed with water. The remaining mixture was subjected to azeotropic dehydration. Then, 0.02 g of KOH and 0.76 g of (ViSiMe$_2$)$_2$O (4.07 mmols) were added to the resulting mixture and heated at 150 degrees C. to reflux through the night. Then, the reaction mixture was neutralized with 0.58 g of 2-chloroethanol (0.011 mols), subjected to stripping under reduced pressure to remove the solvent to obtain the organopolysiloxane (Resin 5) represented by the following formula. The vinyl equivalent was 0.004202 mol/100 g.

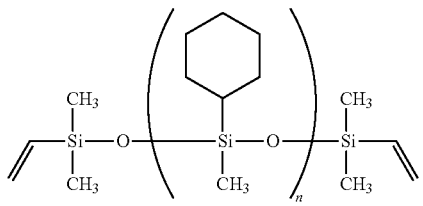

wherein average of n was 300.

Synthesis Example 6

In a flask, placed were 4708.5 g of cyclohexylmethyldimethoxysilane (25 mols) and 144.54 g of acetonitrile, was cooled to below 10 degrees C. of internal temperature. To the resulting mixture, was dropwise added 289.08 g of strong sulfuric acid and 990 g of water, subsequently added 2518.5 g of (HSiMe$_2$)$_2$O (18.75 mols), and stirred through the night. The formed acid was separated, and the resulting mixture was washed with water, subjected to stripping under reduced pressure to remove the solvent to obtain the organohydrogenpolysiloxane 1 represented by the following formula. The amount of the hydrogen gas was 96.46 ml/g or 0.4306 mol/100 g.

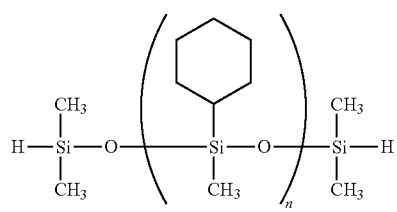

wherein average of n was 2.

Synthesis Example 7

In a flask, placed were 204.34 g of cyclohexyltrimethoxysilane (1.00 mols) and 201.48 g of (HSiMe$_2$)$_2$O (1.50 mols), was cooled to below 10 degrees C. of internal temperature. To the resulting mixture, was dropwise added 16.23 g of strong sulfuric acid and 50.26 g of water, and stirred through the night. The acid was separated, and the resulting mixture was washed with water, subjected to stripping under reduced pressure to remove the solvent to obtain the organohydrogenpolysiloxane 2 represented by the following average formula. The amount of the hydrogen gas was 181.51 ml/g or 0.8103 mol/100 g.

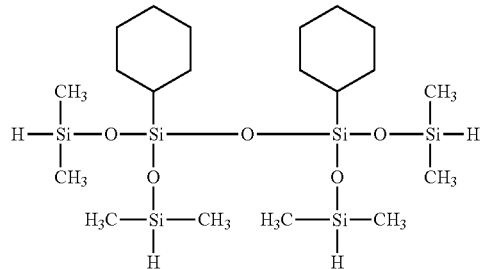 [SMILES: C[SiH](C)O[Si](O[SiH](C)C)(O[Si](O[SiH](C)C)(O[SiH](C)C)C1CCCCC1)C1CCCCC1]

Synthesis Example 8

In a flask, placed were 204.34 g of cyclohexyltrimethoxysilane (1.00 mols) and 302.22 g of (HSiMe$_2$)$_2$O (2.25 mols), was cooled to below 10 degrees C. of internal temperature. To the resulting mixture, was dropwise added 20.26 g of strong sulfuric acid and 62.74 g of water, and stirred through the night. The acid was separated, and the resulting mixture was washed with water, subjected to stripping under reduced pressure to remove the solvent to obtain the organohydrogenpolysiloxane 3 represented by the following average formula. The amount of the hydrogen gas was 189.03 ml/g or 0.8439 mol/100 g.

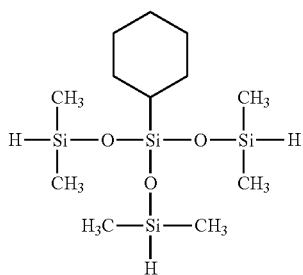

Synthesis Example 9

In a flask, placed were 5376 g of diphenyldimethoxysilane (22.0 mols) and 151.8 g of acetonitrile, cooled to below 10 degrees C. and subjected to the following reaction at a reaction temperature below 10 degrees C. To the resulting mixture, was dropwise added 303.69 g of strong sulfuric acid and 940.36 g of water for one hour, subsequently dropwise added 2216 g of $(HSiMe_2)_2O$ (16.5 mols), and stirred through the night. The acid was separated, and the resulting mixture was washed with water, subjected to stripping under reduced pressure to remove the solvent to obtain the organohydrogenpolysiloxane 4 represented by the following formula. The amount of the hydrogen gas was 90.32 ml/g or 0.403 mol/100 g.

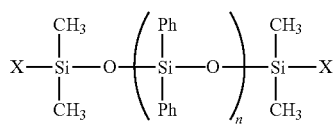

wherein average of n was 2.0 and X was hydrogen atom, a methoxy group and a hydroxy group, 5.0% of X was a methoxy group and a hydroxy group.

Examples 1 to 6

The components prepared in Synthesis Examples 1 to 9 and the following components were mixed in the mass parts shown in the following Table 1 to prepare silicone resin compositions.

(B) Organohydrogenpolysiloxane 5:
Branched organohydrogenpolysiloxane having phenyl groups, represented by the following formula, the amount of hydrogen gas of 170.24 ml/g or 0.76 mol/100 g.

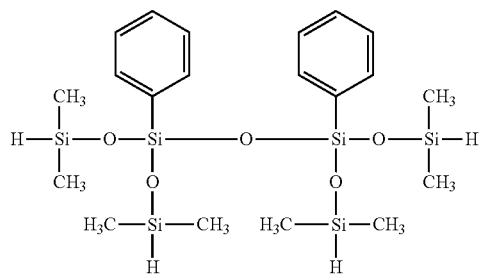 [SMILES: C[SiH](C)O[Si](O[SiH](C)C)(O[Si](O[SiH](C)C)(O[SiH](C)C)c1ccccc1)c1ccccc1]

(C) Curing Catalyst: Octyl Alcohol Solution of Chloroplatinic Acid, Containing 2 Mass % of Platinum.

(D) Antioxidant 1: Irganox 1135, ex BASF Japan Ltd.
Antioxidant 2: Irganox 1076, ex BASF Japan Ltd.

(E) Adhesion-Imparting Agent 1:

In a flask, placed were 158.01 g of vinylmethyldimethoxysilane (1.195 mols), 712.70 g of cyclohexyltrimethoxysilane (3.585 mols), 525.51 g of 3-glycidoxypropyl-methyldimethoxysilane (2.385 mols) and 1500 ml of isopropyl alcohol (IPA), to which was then added a mixture of 49.20 g of an aqueous 25 wt % solution of tetramethylammonium hydroxide and 444 g of water, and stirred for 3 hours. To the resulting mixture, was added toluene, which was then neutralized with an aqueous solution of sodium dihydrogen phosphate, washed with water, and subjected to stripping under reduced pressure to remove the solvent to obtain the compound represented by the following formula. The product obtained was a mixture where k was 1, 2 and 3, j was 1 and 2, R was H, methyl and isopropyl. This compound is hereinafter called adhesion-imparting agent 1.

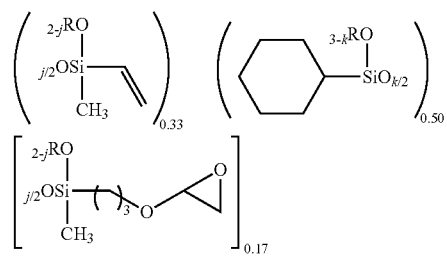

(E) Adhesion-Imparting Agent 2:

In a flask, placed were 264.46 g of vinylmethyldimethoxysilane (2.00 mols), 733.08 g of diphenyldimethoxysilane (3.00 mols), 1181.5 g of 3-glycidoxypropyl-trimethoxysilane (5.00 mols) and 2700 ml of isopropyl alcohol (IPA), to which was then added a mixture of 82.00 g of an aqueous 25 wt % solution of tetramethylammonium hydroxide and 740 g of water, and stirred for 3 hours. To the resulting mixture, was added toluene, which was then neutralized with an aqueous solution of sodium dihydrogen phosphate, washed with water, and subjected to stripping under reduced pressure to remove the solvent to obtain the compound represented by the following formula. The product obtained was a mixture where k was 1, 2 and 3, j was 1 and 2, R was H, methyl and isopropyl. This compound is hereinafter called adhesion-imparting agent 2.

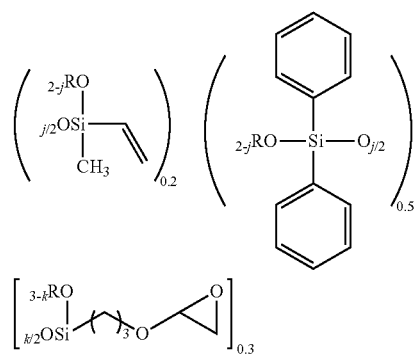

Comparative Examples 1 and 2

In Comparative Examples 1 and 2, the following components, in place of the component prepared in the Synthesis Examples 1 to 9, were mixed in the amounts shown in Table 1 to prepare silicone resin compositions.

(1) Polysiloxane (VF1):
The vinyl equivalent was 0.00587 mol/100 g.

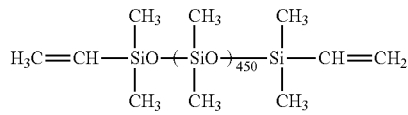

(2) Vinylmethylsiloxane (VMQ):
Vinylmethylsiloxane having a resin structure composed of 50 mol % of $SiO_2$ units, 42.5 mol % of $(CH_3)_3SiO_{0.5}$ units and 7.5 mol % of $Vi_3SiO_{0.5}$ units. The vinyl equivalent was 0.05425 mol/100 g.

(3) Hydrogenpolysiloxane (HDM):
The amount of the hydrogen gas was 347.81 ml/g or 1.553 mols/100 g.

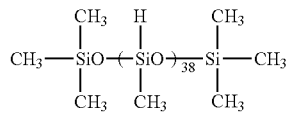

Comparative Example 3

An alkenyl group-containing polyorganosiloxane and polysiloxane (VF 2) represented by the following formula were used, in place of the Resins 1 to 5 prepared in the Synthesis Examples 1 to 5, in the amounts shown in Table 1 to prepare silicone resin compositions.

(1) Alkenyl group-containing polyorganosiloxane (Resin 6):
The vinyl equivalent was 0.195 mol/100 g.

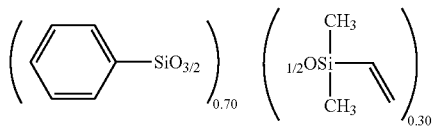

(2) Polysiloxane (VF 2): Phenylmethylpolysiloxane having vinyl groups at the both terminals. The vinyl equivalent was 0.0185 mol/100 g.

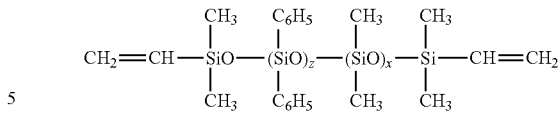

wherein the molecular weight was 11000, z was 30 and x was 68.

The silicone resin compositions prepared in Examples 1 to 6 and Comparative Examples 1 to 3 were each subjected to molding under heating at 150 degrees C. for 4 hours to obtain a cured product with a length of 110 mm, a width of 120 mm, and a thickness of 2 mm. Appearance of the cured products was observed by the naked eyes. The tensile strength, hardness and tensile elongation of the cured product were determined according to JIS K 6301. The hardness was determined with a type A spring test instrument. The results are as shown in Table 1, where the amount of cycloalkyl (%) is the mass % of the cycloalkyl group, based on the total mass of the organosiloxane (A) and the organohydrogenpolysiloxane (B).

Moisture Permeation Rate, i.e., Moisture Permeability

The silicone resin compositions prepared in Examples 1 to 6 and Comparative Examples 1 to 3 were subjected to molding under heating at 150 degrees C. for 4 hours to obtain a cured product with a length of 110 mm, a width of 120 mm, and a thickness of 2 mm. The moisture permeation rate was determined in the Lyssy testing method with L80-5000, ex Lyssy company, according to JIS K 7129.

Solvent Resistance, Indicated by a Degree of Swelling

The cured products prepared above were cut into pieces of a length of 3 cm, a width of 3 cm, and a thickness of 2 mm to prepare samples. The samples were dipped in acetone for one hour and, then, the length of each sample was measured. The degree of swelling, based on the initial length of 3 cm, was calculated by the following formula.

Degree of swelling(%)={[Length after one hour(cm)−Initial length(3 cm)]×100}/Initial length(3 cm)

Light Transmittance

The silicone resin compositions prepared in Examples 1 to 6 and Comparative Examples 1 to 3 were subjected to molding under heating at 150 degrees C. for 4 hours to obtain a cured product with a length of 20 mm, a width of 50 mm, and a thickness of 1 mm. The light transmittance was determined at the scanning speed of 200 nm/min and in the scanning wavelengths of from 300 nm to 800 nm, with Spectrophotometer U-4100, ex Hitachi High Technologies Co. Ltd. The results of the light transmittance at the wavelength of 450 nm are as shown in Table 1.

TABLE 1

| | Component, parts by mass | | Ex. 1 | Ex. 2 | Ex. 3 | Ex. 4 | Ex. 5 |
|---|---|---|---|---|---|---|---|
| | Si—H/Si-Vi | molar ratio | | | 1.1 | | |
| | Amount of cyclohexyl | % | 41.1 | 41.4 | 41.8 | 42.0 | 42.1 |
| (A) | Regin 1 | | 56.3 | 57.8 | 58.2 | 58.3 | 58.5 |
| | Regin 2 | | 15.0 | 15.1 | | | |
| | Regin 3 | | | | 15.1 | | |
| | Regin 4 | | | | | 15.2 | |
| | Regin 5 | | | | | | 15.2 |
| | Regin 6 | | | | | | |
| | VF1 | | | | | | |
| | VF2 | | | | | | |
| | VMQ | | | | | | |
| (B) | Organohydrogenpolysiloxane1 | | 26.2 | 22.2 | 21.8 | 21.7 | 21.5 |
| | Organohydrogenpolysiloxane2 | | 2.5 | | 4.9 | 4.8 | 4.8 |
| | Organohydrogenpolysiloxane3 | | | 4.9 | | | |
| | Organohydrogenpolysiloxane4 | | | | | | |
| | Organohydrogenpolysiloxane5 | | | | | | |
| | HDM | | | | | | |

TABLE 1-continued

|  |  |  |  |  |  |  |  |
|---|---|---|---|---|---|---|---|
| (C) | Platinum catalyst |  | 0.03 | 0.03 | 0.03 | 0.03 | 0.03 |
| (D) | Antioxidant 1 |  | 0.3 | 0.3 | 0.3 | 0.3 | 0.3 |
|  | Antioxidant 2 |  |  |  |  |  |  |
| (E) | Adhesion-imparting agent 1 |  | 2 | 2 | 2 | 2 | 2 |
|  | Adhesion-imparting agent 2 |  |  |  |  |  |  |
| Properties | After cured | Appearance | colorless and transparent | colorless and transparent | colorless and transparent | colorless and transparent | colorless and transparent |
|  |  | Hardness Type A | 89 | 83 | 69 | 51 | 42 |
|  |  | Type D | 35 | 32 | — | — | — |
|  |  | Tensile strength MPa | 0.8 | 1.8 | 2.5 | 3.6 | 2.3 |
|  |  | Tensile elongation % | 70 | 65 | 80 | 90 | 120 |
|  |  | Moisture permeation rate g/m2*day | 2 | 4 | 6 | 5 | 8 |
|  |  | Degree of swelling % | 3 | 3 | 3 | 3 | 3 |
|  |  | Light transmittance % T(450 nm) | 99.2 | 99.1 | 98.9 | 98.8 | 98.9 |

| Component, parts by mass |  |  | Ex. 6 | Com. Ex. 1 | Com. Ex. 2 | Com. Ex. 3 |
|---|---|---|---|---|---|---|
|  | Si—H/Si-Vi | molar ratio |  | 1.1 |  |  |
|  | Amount of cyclohexyl | % | 36.5 | 0 | 0 | 0 |
| (A) | Regin 1 |  | 44.6 |  |  |  |
|  | Regin 2 |  | 31.2 |  |  |  |
|  | Regin 3 |  |  |  |  |  |
|  | Regin 4 |  |  |  |  |  |
|  | Regin 5 |  |  |  |  |  |
|  | Regin 6 |  |  |  |  | 57.7 |
|  | VF1 |  |  | 66.5 | 36.5 |  |
|  | VF2 |  |  |  |  | 15.2 |
|  | VMQ |  |  | 32 | 61 |  |
| (B) | Organohydrogenpolysiloxane1 |  |  |  |  |  |
|  | Organohydrogenpolysiloxane2 |  |  |  |  |  |
|  | Organohydrogenpolysiloxane3 |  |  |  |  |  |
|  | Organohydrogenpolysiloxane4 |  | 19.4 |  |  | 22.3 |
|  | Organohydrogenpolysiloxane5 |  | 4.8 |  |  | 4.8 |
|  | HDM |  |  | 1.5 | 2.5 |  |
| (C) | Platinum catalyst |  | 0.03 | 0.02 | 0.02 | 0.02 |
| (D) | Antioxidant 1 |  |  |  |  |  |
|  | Antioxidant 2 |  | 0.1 |  |  |  |
| (E) | Adhesion-imparting agent 1 |  | 4 | 2 | 2 |  |
|  | Adhesion-imparting agent 2 |  |  |  |  | 4 |
| Properties | After cured | Appearance | colorless and transparent | colorless and transparent | colorless and transparent | colorless and transparent |
|  |  | Hardness Type A | 61 | 40 | 85 | 83 |
|  |  | Type D | 16 | — | 31 | 24 |
|  |  | Tensile strength MPa | 1.3 | 5 | 2 | 1.6 |
|  |  | Tensile elongation % | 130 | 120 | 30 | 40 |
|  |  | Moisture permeation rate g/m2*day | 4 | 68 | 52 | 23 |
|  |  | Degree of swelling % | 6 | 13 | 13 | 7 |
|  |  | Light transmittance % T(450 nm) | 99.1 | 99.8 | 99.6 | 99.5 |

The present silicone resin composition provided the cured product which had lower moisture permeability and better solvent resistance. In contrast, the cured product of the silicone resin composition without a cycloalkyl group had higher moisture permeability and poorer solvent resistance.

Further, the optical semiconductor devices encapsulated with the cured product of the silicone resin composition prepared in Examples 1 to 3 and Comparative Examples 1 to 3 were prepared, as will be mentioned below.

Preparation of an Optical Semiconductor Device

A cupped pre-molded package for an LED which had dimensions of 3 mm×3 mm×1 mm and an opening having a diameter of 2.6 mm and was equipped, on the bottom surface, with a copper lead frame plated with silver of a thickness of 2 μm were treated with argon plasma at 100 W for 10 seconds of the exposure time. An electrode of an InGaN type blue light-emitting device was connected to the lead frame present on the bottom with a silver past, namely, conductive adhesive. A counter electrode of the light emitting device was connected to a counter lead frame with a gold wire. Then, each of the silicone resin compositions prepared in Examples 1 to 3 and Comparative Examples 1 and 2 were applied to the opening of each of the packages, and cured at 60 degrees C. for one hour and subsequently at 150 degrees C. for 4 hours to prepare optical semiconductor devices.

While an electrical current of 25 mA was applied to the aforesaid optical semiconductor devices to light on, the devices were left in a hydrogen sulfide gas atmosphere at 150 degrees C. for 1000 hours. Then, the extent of discoloration on the silver plated surface of the package was observed with the naked eyes. Besides, the optical semiconductor devices prepared were subjected to a heat cycle test at −40 to 100 degrees C./200 cycles and an LED lighting test at 60 degrees C. and 90RH % for 500 hours, and the number of the test pieces which showed cracks or peeling in interface of the package and the discoloration on the silver plated surface in the package were observed with the naked eyes.

TABLE 2

| | | Ex. 1 | Ex. 2 | Ex. 3 | Com. Ex. 1 | Com. Ex. 2 | Com. Ex. 3 |
|---|---|---|---|---|---|---|---|
| Sulfuration test, 150° C./1000 hr | Appearance | Clear and colorless | Clear and colorless | Clear and colorless | Yellowing | Yellowing slightly | Yellowing slightly |
| Heat cycle test, −40-100° C./200 cycle | Destructed piece | 0/5 | 0/5 | 0/5 | 1/5 | 5/5 | 0/5 |
| | Appearance | Clear and colorless | Clear and colorless | Clear and colorless | Clear and colorless | Clear and colorless | Clear and colorless |
| Lighting test under high temperature and high humidity, 60° C./90 RH % 500 hr | Destructed piece | 0/5 | 0/5 | 0/5 | 2/5, peeled. | 1/5, Cracks occurred | 1/5, Cracks occurred. |
| | Appearance | Clear and colorless | Clear and colorless | Clear and colorless | Yellowing | Yellowing | Yellowing |

In the optical semiconductor device encapsulated with the cured product of the present silicone resin composition, no discoloration due to hydrogen sulfide occurred on the silver plated surface in the package, no peeling or cracks occurred at the high temperature and high humidity conditions, so that durability in the reflection efficiency was superior.

The silicone resin compositions prepared in Examples 1 and 6 and Comparative Example 3 were used as a lens molding material, as mentioned below.

The lenses were molded, using the silicone resin composition prepared in Examples 1 and 6 and Comparative Example 3, at an injection pressure of 20 MPa·s, a curing temperature of 150 degrees C., and a curing time of 90 seconds with a 20-ton mold injection instrument equipped with a mold for 16 lenses at one shot. The lenses were taken out from the mold, and post-cured at 150 degrees C. for 4 hours. The shape of the lens thus obtained is shown in FIG. 1. The lens products were subjected to the reflow test in moisture adsorption conditions at 85 degrees C. and 60 RH % for 168 hours to see whether cracks occurred or not. The results are as shown in Table 3.

A silicon wafer which had dimensions of 5 cm×5 cm were spin coated with the silicone resin compositions prepared in Examples 1 and 6 and Comparative Example 3, and cured at 60 degrees C. for one hour, and subsequently at 150 degrees C. for 4 hours. A refracture index of each of the cured products thus obtained was measured at wavelengths of 486 nm, 589 nm, and 656 nm at measurement temperature of 25 degrees C., using a refracture index measuring instrument, Prism Coupler, ex Metricon Co. Ltd. The Abbe's number was calculated by the following formula.

$$\nu_D = (n_D - 1)/(n_F - n_C)$$

wherein $n_C$, $n_D$ and $n_F$ are the refractive indices at the wavelengths of the Fraunhofer C special lines: 656 nm, D special lines: 589 nm, and F special lines: 486 nm, respectively.

TABLE 3

| | | Ex. 1 | Ex. 6 | Com. Ex. 3 |
|---|---|---|---|---|
| Reflow test in moisture adsorption conditions, 85° C./60RH %/168 hr | Destructed piece | 0/16 | 0/16 | 4/16 Cracks occurred. |
| | Appearance | Clear and colorless | Clear and colorless | Clear and colorless |
| Refracture index at 486 nm | | 1.49930 | 1.51833 | 1.52394 |
| Refracture index at 589 nm | | 1.49265 | 1.51121 | 1.51251 |
| Refracture index at 656 nm | | 1.48913 | 1.50728 | 1.50724 |
| Abbe's number | | 49 | 46 | 31 |

The Abbe's numbers of the cured products of the present silicone resin compositions were high and the cured products, lenses, had remarkable moisture resistance.

INDUSTRIAL APPLICABILITY

The present silicone resin composition has remarkably low gas permeability. Further, the present silicone resin composition can provide a cured product which has good solvent resistance and light transparency and is suitable for use in various general purposes. In particular, the present silicone resin composition is advantageously used as an encapsulating material for optical semiconductors, such as high brightness LEDs. The present silicone resin composition can provide an optical semiconductor package having remarkable discoloration resistance, durability in reflection efficiency, and reliability.

The invention claimed is:

1. A silicone resin composition comprising
(A) an organopolysiloxane having at least two alkenyl groups per molecule, and is represented by the following average compositional formula (1):

$$R^1_a R^2_b R^3_c SiO_{(4-a-b-c)/2} \quad (1)$$

wherein $R^1$ is a cycloalkyl group having 4 to 8 carbon atoms, $R^2$ is a substituted or unsubstituted monovalent hydrocarbon group which has 1 to 10 carbon atoms and is not an alkenyl group nor a cycloalkyl group, $R^3$ is an alkenyl group having 2 to 8 carbon atoms, a is the number of 0.3 to 1.0, b is the number of 0.05 to 1.5, and c is the number of 0.05 to 0.8, provided that a+b+c is 0.5 to 2.0, wherein component A is a mixture of an organopolysiloxane having a linear structure whose main chain is composed of $R_2SiO_{2/2}$ units and which has $R_3SiO_{1/2}$ units at both terminals, wherein R is a group selected from the groups defined for $R^1$, $R^2$, or $R^3$ set forth above, and an organopolysiloxane having a three dimensional network structure which comprises $R^6SiO_{3/2}$ units and $R^5_q R^6_r SiO_{1/2}$ units, wherein $R^5$ is a vinyl or allyl group, $R^6$ is a group selected from the groups defined for $R^1$ and $R^2$ set forth above, q is 1, 2, or 3, and r is 0, 1, or 2, provided that a total of q and r is 3, wherein an amount of the organopolysiloxane having a three dimensional network structure is 20 to 95% by mass based on a total mass of component (A), (B) an organohydrogenpolysiloxane having at least two hydrogen atoms bonded to a silicon atom, that is, SiH groups, and is represented by the following average compositional formula (2):

$$R^1_a R^2_b H_d SiO_{(4-a-b-d)/2} \quad (2)$$

wherein $R^1$ is a cycloalkyl group having 4 to 8 carbon atoms, $R^2$ is a substituted or unsubstituted, monovalent hydrocarbon groups which has 1 to 10 carbon atoms and is not an alkenyl group nor a cycloalkyl group, a is the number of 0 to 1.4, b is the number of 0.6 to 1.5, and d is the number of 0.05 to 1.0, provided that a+b+d is 1.0 to 2.5, (C) a catalytic amount of a curing catalyst, and (D) 0.001 to 3 parts by mass of an antioxidant, relative to a total 100 parts by mass of components (A) and (B), wherein an amount of the cycloalkyl groups is 20 to 80 mass %, based on the total mass of components (A) and (B).

2. The silicone resin composition according to claim 1, wherein the composition comprises organohydrogenpolysiloxane (B) in an amount such that the amount of the SiH groups in component (B) is 0.5 to 4.0 equivalents per equivalent of the alkenyl groups of component (A).

3. The silicone resin composition according to claim 1, wherein the composition further comprises an adhesion-imparting agent (E).

4. The silicone resin composition according to claim 1, wherein the composition further comprises an inorganic filler.

5. The silicone resin composition according to claim 1, wherein a cured product with a thickness of 1 mm from the composition has a moisture permeability of 15 g/m$^2$ day or less.

6. The silicone resin composition according to claim 1, wherein a cured product from the composition has hardness of 90 or less, as determined with a type A durometer, as stipulated in the Japanese Industrial Standards K 6301.

7. The silicone resin composition according to claim 1, wherein a cured product from the composition has a light transmittance of 90% or more, as determined at one wavelength selected from 400 nm to 500 nm.

8. The silicone resin composition according to claim 1, wherein a cured product from the composition has Abbe's number of not less than 40 and not more than 90.

9. An optical semiconductor encapsulating material comprising the silicone resin composition according to claim 1.

10. An optical semiconductor device encapsulated with a cured product obtained by curing the silicone resin composition according to claim 1.

11. A material selected from the group consisting of lens molding materials, silicone coating materials for vehicle installation, resin materials for screen-print, film materials, corrosion-preventing or waterproof sealing materials for constructions, waterproof protective materials for cooking equipment, waterproof treatment materials for baby toys, glass coating materials, preservation or waterproof paints for wood, additive in filter materials for fine powder, and waterproof or gas corrosion-preventing coating materials for metal, wherein said material comprises a silicone resin composition according to any one of claims 1, 2 to 3, 8.

* * * * *